Dec. 11, 1962 W. ORLOFF ET AL 3,068,424

TRANSISTOR CLASS C AMPLIFIER

Filed March 23, 1960

*INVENTORS,*

WILLIAM ORLOFF

BERNARD REICH

*BY* Harry M. Saragovitz

ATTORNEY

United States Patent Office 3,068,424
Patented Dec. 11, 1962

3,068,424
TRANSISTOR CLASS C AMPLIFIER
William Orloff, Matawan, and Bernard Reich, Wanamassa, N.J., assignors to the United States of America as represented by the Secretary of the Army
Filed Mar. 23, 1960, Ser. No. 17,231
2 Claims. (Cl. 330—40)
(Granted under Title 35, U.S. Code (1952), sec. 266)

The invention described herein may be manufactured and used by or for the Government for governmental purposes, without the payment of any royalty thereon.

The present invention relates to a tuned class C transistor amplifier and more particularly to a novel and unconventional biasing arrangement for the base-emitter junction thereof.

A class C amplifier must be biased below cutoff, so that collector current flows for less than one half (180 electrical degrees) of a cycle of input voltage. In prior art circuits a reverse bias is applied to the base-emitter junction in order to achieve the desired operation, however we have found that a small forward voltage may be applied to the junction without causing any appreciable forward current flow and hence resulting in operation below cutoff. This biasing arrangement is advantageous where it is desired to achieve a pulse of collector current which approaches 180 electrical degrees, or one half the duration of the input signal.

It is therefore an object of this invention to provide an improved transistor type class C amplifier.

Figure 1:
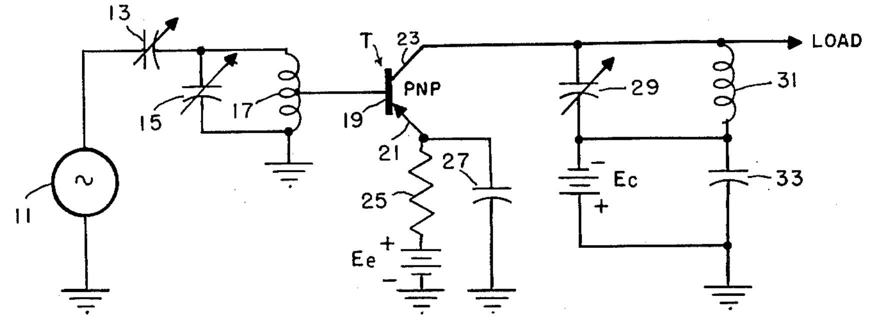
Figure 2:
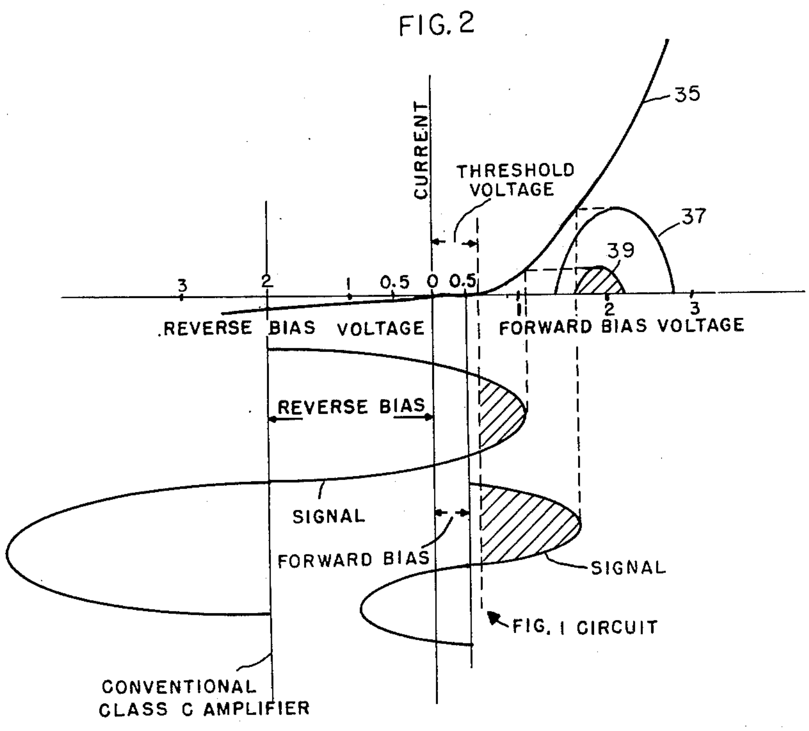

Other objects of this invention will become apparent from the following specification and drawing wherein:

FIGURE 1 is a circuit diagram of a circuit embodying the principle of the invention and FIGURE 2 illustrates the rectification characteristic of the base-emitter junction of a typical silicon transistor.

In FIGURE 1 the signal source 11 is connected to the base-emitter 19, 21 circuit of PNP transistor T through a variable coupling capacitor 13 and an input tank circuit composed of variable capacitor 15 and coil 17. The output is taken from across the output tank circuit, composed of variable capacitor 29 and coil 31. The collector 23 is reverse biased in conventional fashion by means of battery E*c*, the negative terminal of which is connected to the collector through the coil 31 of the output tank. The base-emitter junction is biased in the forward direction by means of battery E*e*, the positive terminal of which is connected to the emitter 21 through a current limiting resistor 25. 27 and 33 are RF by-pass capacitors.

The mode of operation of the circuit will be understood with reference to FIGURE 2, wherein the curve 35 is the rectification characteristic of a typical base-emitter junction of a silicon transistor. The curve shows a small reverse current at negative (reverse) bias voltage and no appreciable forward current flow until the forward voltage reaches .7 volt, therefore it is necessary to apply at least .7 volt in the forward direction before an appreciable current flows. The voltage is known as the "threshold voltage" and varies with the type of semiconductor material, being of the order of .5–1.0 volt for a silicon junction but generally less for germanium junctions.

FIGURE 2 illustrates the biasing arrangement of a conventional class C amplifier biased at a reverse voltage of 2 volts. Such an amplifier is illustrated in the book "Transistor Physics and Circuits" by Riddle and Ristenbatt, Prentice-Hall, Inc., 1958, on page 220. A sinusoidal input signal is shown superimposed on the bias. This corresponds to signal source 11 in FIGURE 1. The shaded portion of the wave represents the portion of the cycle during which current flows across the base-emitter junction and also in the collector circuit. 39 is the pulse of current delivered to the output tank.

The forward bias E*e*, in FIGURE 1, is adjusted, according to the invention, to slightly less than the threshold voltage (.5 in FIGURE 2), so that no appreciable base-emitter current flows in the absence of an applied signal. The transistor is therefore below cutoff and class C operation results. A sinusoidal signal is shown superimposed on the .5 volt forward bias. This signal produces a pulse of current 37 in the collector circuit. It is apparent from FIGURE 2 that with the forward bias of the invention a smaller signal can be used to obtain an output pulse of longer duration. Further, it is impossible with the prior art circuit to achieve output pulses approaching 180 electrical degrees of the input. It can be seen from FIGURE 2 that even if the reverse bias of the prior art circuit is reduced to zero, the transistor will conduct for substantially less than 180°, due to the fact that the signal must exceed the threshold voltage before conduction takes place. While the biasing arrangement may be used with any type transistor, it is particularly advantageous when used with silicon transistors, due to the relatively high threshold voltage thereof.

While a PNP transistor has been illustrated it is obvious that an NPN type can be used in the circuit by reversing the polarity of both bias sources.

In a circuit constructed according to the invention a type p.s.i. silicon transistor manufactured by Pacific Semiconductor Corp. was used. Both tank circuits were tuned to 70 mc. This data is merely illustrative and the practice of the invention is not limited to the specific values given.

While we have disclosed specific structure for carrying out the invention, we do not intend to be limited thereby, but only by the appended claims.

What is claimed is:

1. A class C tuned amplifier comprising a silicon junction transistor including an emitter, base and collector, a signal source coupled across the base-emitter junction thereof via a tuned circuit, a reverse bias source connected to said collector via an output tank circuit, a source of forward bias voltage connected to said base-emitter junction, said voltage being less than the threshold voltage of said junction, whereby no base-emitter current flows in the absence of an input signal and class C operation results.

2. A class C tuned amplifier comprising a silicon transistor including base, emitter and collector electrodes in which no appreciable forward base-emitter junction current flows until a certain forward threshold voltage is applied to said base-emitter junction, a signal source coupled across said base-emitter junction, a tuned load circuit coupled to said collector, a potential source biasing said collector in the reverse direction, and a second potential source biasing said base-emitter junction in the forward direction, the magnitude of said second potential source being less than the threshold voltage of said base-emitter junction, whereby no base-emitter current flows in the absence of an input signal and class C operation results.

References Cited in the file of this patent

UNITED STATES PATENTS

| | | |
|---|---|---|
| 2,762,870 | Sziklai et al. | Sept. 11, 1956 |
| 2,773,945 | Theriault | Dec. 11, 1956 |
| 2,791,644 | Sziklai | May 7, 1957 |
| 2,809,239 | Nielsen | Oct. 8, 1957 |
| 2,851,542 | Lohman | Sept. 9, 1958 |
| 2,860,195 | Stanley | Nov. 11, 1958 |
| 2,896,029 | Lin | July 21, 1959 |
| 2,941,046 | Pokrant | June 14, 1960 |
| 2,951,208 | Barton | Aug. 30, 1960 |
| 2,955,258 | Whatley | Oct. 4, 1960 |